(12) United States Patent
Saito et al.

(10) Patent No.: US 9,846,203 B2
(45) Date of Patent: Dec. 19, 2017

(54) STORAGE BATTERY STATE DETECTION APPARATUS AND STORAGE BATTERY STATE DETECTION METHOD

(71) Applicant: Mitsubishi Electric Corporation, Tokyo (JP)

(72) Inventors: Hiroyuki Saito, Tokyo (JP); Hideaki Tani, Tokyo (JP); Satoshi Wachi, Tokyo (JP); Takafumi Hara, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 309 days.

(21) Appl. No.: 14/771,887

(22) PCT Filed: Apr. 30, 2013

(86) PCT No.: PCT/JP2013/062605
§ 371 (c)(1),
(2) Date: Sep. 1, 2015

(87) PCT Pub. No.: WO2014/178108
PCT Pub. Date: Nov. 6, 2014

(65) Prior Publication Data
US 2016/0011275 A1 Jan. 14, 2016

(51) Int. Cl.
*G01N 27/416* (2006.01)
*G01R 31/36* (2006.01)
(Continued)

(52) U.S. Cl.
CPC ...... *G01R 31/3693* (2013.01); *F02N 11/0862* (2013.01); *G01R 31/3662* (2013.01);
(Continued)

(58) Field of Classification Search
CPC .............. F02N 2250/02; F02N 2200/06; F02N 2200/063; G01R 31/3624; G01R 31/3651; G01R 31/3675; G01R 31/3693
(Continued)

(56) References Cited

U.S. PATENT DOCUMENTS

2009/0088994 A1 4/2009 Machiyama et al.
2009/0115419 A1* 5/2009 Ueda .................. G01R 31/3624
324/430

(Continued)

FOREIGN PATENT DOCUMENTS

JP 2007-216707 A 8/2007
JP 2009-286215 A 12/2009
(Continued)

OTHER PUBLICATIONS

International Search Report pf PCT/JP2013/062605 dated Jul. 9, 2013.

*Primary Examiner* — Nathaniel Pelton
*Assistant Examiner* — Johali Torres Ruiz
(74) *Attorney, Agent, or Firm* — Sughrue Mion, PLLC; Richard C. Turner

(57) ABSTRACT

It is possible to accurately estimate a starting current and calculate a precise starting minimum voltage without being influenced by a change in a storage battery state or a starting state by updating a current/voltage correlation characteristic corresponding to a deterioration state of a storage battery each time a current/voltage data set obtained when a starter is driven is newly stored in association with the deterioration state of the storage battery and by calculating the starting current corresponding to a present voltage immediately before start in accordance with the current/voltage correlation characteristic corresponding to the present deterioration state of the storage battery when determination is made as to whether or not to drive the starter.

6 Claims, 7 Drawing Sheets

(51) Int. Cl.
*F02N 11/08* (2006.01)
*F02D 29/02* (2006.01)

(52) U.S. Cl.
CPC .......... *F02D 29/02* (2013.01); *F02N 2200/06* (2013.01); *F02N 2250/02* (2013.01); *G01R 31/3624* (2013.01); *G01R 31/3651* (2013.01); *G01R 31/3675* (2013.01)

(58) Field of Classification Search
USPC .................................................. 324/429, 430
See application file for complete search history.

(56) References Cited

U.S. PATENT DOCUMENTS

2009/0295399 A1   12/2009  Ueda et al.
2010/0269776 A1*  10/2010  Mizuno .................. F02D 29/06
                                                          123/179.4

FOREIGN PATENT DOCUMENTS

| | | |
|---|---|---|
| JP | 2010-024906 A | 2/2010 |
| JP | 4459997 B | 4/2010 |
| JP | 2010-255464 A | 11/2010 |
| JP | 2010-270747 A | 12/2010 |
| JP | 4641838 B | 3/2011 |
| JP | 2012-172567 A | 9/2012 |
| WO | 2007/105595 A1 | 9/2007 |

\* cited by examiner

FIG. 5
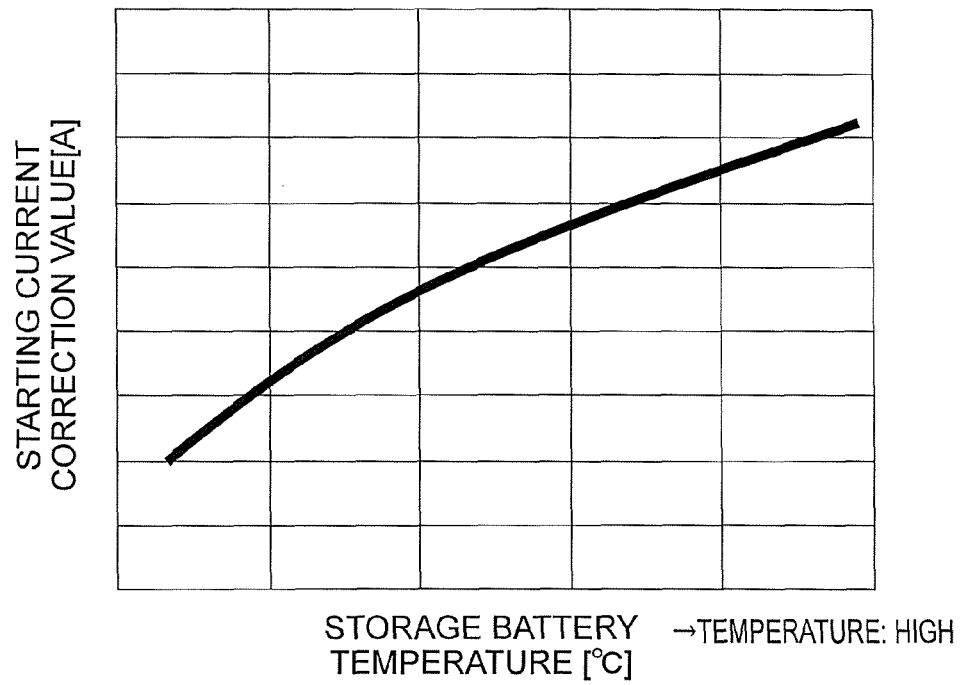
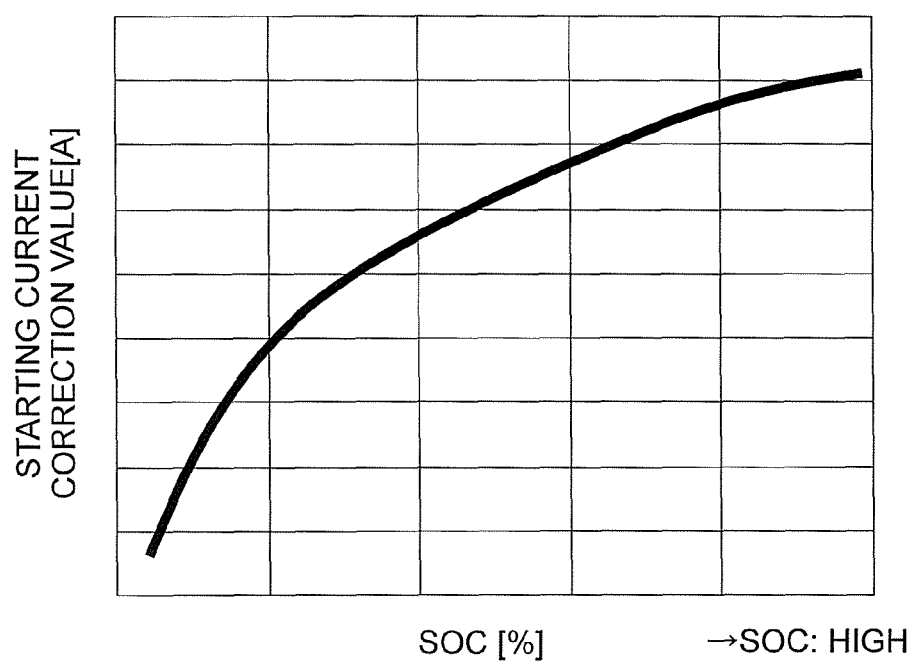

FIG. 6
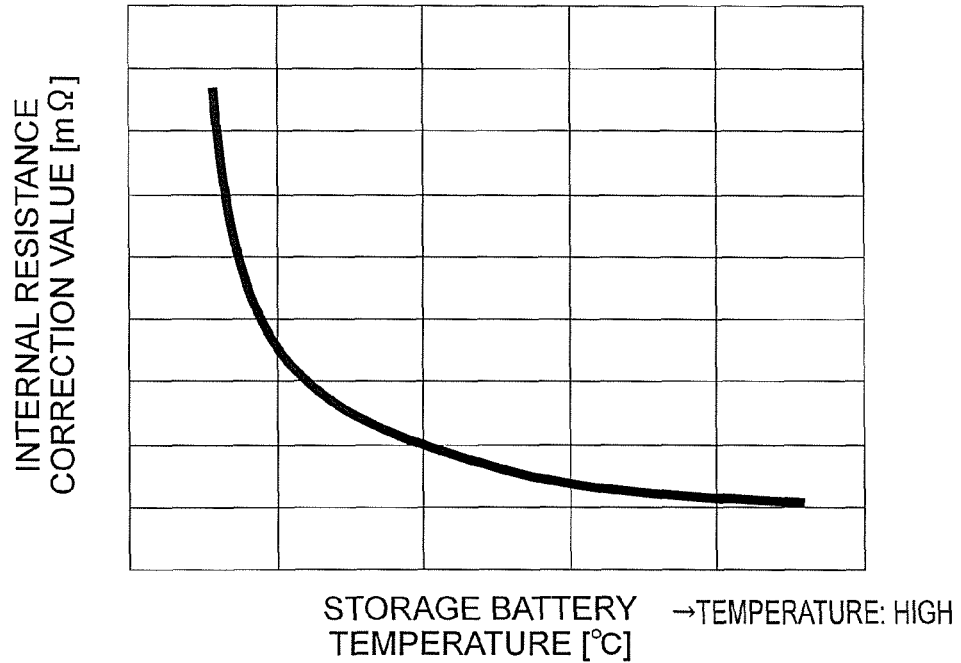
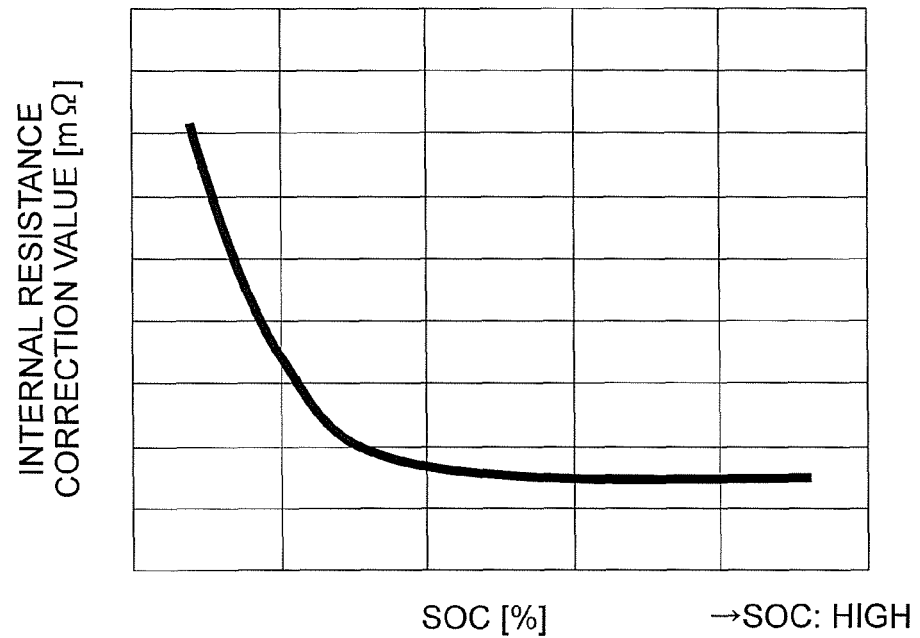

STORAGE BATTERY STATE DETECTION APPARATUS AND STORAGE BATTERY STATE DETECTION METHOD

CROSS REFERENCE TO RELATED APPLICATIONS

This is a National Stage of International Application No. PCT/JP2013/062605 filed Apr. 30, 2013, the contents of which are incorporated herein by reference in its entirety.

TECHNICAL FIELD

The present invention relates to a state detection apparatus for a storage battery for estimating a battery voltage of the storage battery, which is exhibited immediately before a starting load such as a starter for starting an internal combustion engine of a vehicle is driven, and to a state detection method for a storage battery.

BACKGROUND ART

In recent years, in regard to a vehicle driven by an internal combustion engine, a system for automatically stopping or restarting the internal combustion engine during driving has been brought to practical use in order to meet a demand for low fuel consumption. Further, there is a need to determine whether or not the storage battery mounted on the vehicle can output electric power necessary to restart the internal combustion engine so as to positively restart the internal combustion engine after being automatically stopped.

Hitherto, in view of the need, a charging state of the storage battery is estimated when the vehicle is stopped, and when it is determined that the electric power necessary to restart the internal combustion engine can be output, the internal combustion engine is allowed to be automatically stopped (idling stop) (see, for example, Patent Literature 1).

In this case, when the internal combustion engine is restarted, a battery voltage of the storage battery serving as a power supply greatly drops due to power consumption of a starting load such as a starter. Further, the storage battery is normally used also as a power source to an ignition device and a control device for the internal combustion engine. Therefore, when the battery voltage of the storage battery greatly drops due to the restart of the internal combustion engine, the ignition device and the control device cannot be appropriately operated, with the result that the internal combustion engine cannot be normally restarted in some cases.

Therefore, in order to normally restart the internal combustion engine, it is necessary not only to secure the electric power necessary to restart the internal combustion engine, but also to maintain an amount of reduction in the battery voltage of the storage battery, which is caused by the restart of the internal combustion engine, to a level equal to or lower than a predetermined value. That is, a starting minimum voltage Vmin that is a voltage value at which the battery voltage of the storage battery becomes lowest needs to be equal to or higher than a threshold value that does not influence the restart of the internal combustion engine.

In the related art, in view of such a need, a starting current ΔImax (current value obtained by subtracting a current I0 immediately before the start, which is measured immediately before the starter is driven, from a peak current Imax measured while the starter is being driven) discharged from the storage battery is calculated and stored. Then, based on the starting minimum voltage Vmin of the storage battery, which is calculated from the stored starting current ΔImax and from the internal resistance and the battery voltage of the storage battery that are exhibited immediately before the starter is driven, determination is made as to whether or not to restart the internal combustion engine by driving the starter (see, for example, Patent Literature 2).

Further, in the related art disclosed in Patent Literature 2, in order to further increase determination accuracy, a temperature or a charging rate of the storage battery and the calculated starting current ΔImax are stored in association with each other. Then, based on the association, the starting current ΔImax corresponding to the temperature or the charging rate of the storage battery exhibited immediately before the starter is driven is estimated, and the starting minimum voltage Vmin of the storage battery is calculated.

Further, it is known that there are large fluctuations in the battery voltage of the storage battery due to depolarization when a period since a previous time at which the internal combustion engine is automatically stopped until this time at which the internal combustion engine is restarted is within a predetermined period. Therefore, in order to further increase the determination accuracy, when the above-mentioned period is within the predetermined period, the estimation of the starting current ΔImax based on the battery voltage of the storage battery is inhibited, or the starting current ΔImax is estimated by making a correction thereto in consideration of the depolarization (see, for example, Patent Literature 3).

CITATION LIST

Patent Literature

[PTL 1] JP 2006-258070 A
[PTL 2] JP 4459997 B2
[PTL 3] JP 2012-172567 A

SUMMARY OF INVENTION

Technical Problem

However, the related art has the following problems.

In the related art, as described above, a starting current ΔImax is estimated immediately before the starter is driven (time point at which determination is made as to whether or not to restart the internal combustion engine by driving the starter).

Further, the starting current ΔImax is a parameter that affects not only a temperature and a charging rate of the storage battery but also a storage battery state such as a charging/discharging polarization state, a stratification polarization state of the storage battery, or a deterioration state of the storage battery and a starting load state such as a vehicle wiring. That is, when there is a change in the storage battery state and the starting load state, the starting current ΔImax greatly fluctuates.

In this case, in the related art, an estimation value calculated based on a voltage fluctuation and an internal resistance estimation value, which are exhibited at the previous time at which the starter is started, is used as the previous starting current ΔImax. However, the thus-estimated starting current ΔImax is inferior in accuracy to the previous starting current ΔImax detected by a direct current sensor or the like. As a result, it is difficult to accurately estimate the starting current ΔImax. Therefore, a starting minimum voltage Vmin of the storage battery calculated based on the estimated starting current ΔImax has a large error with respect to an actual starting minimum voltage Vmin of the storage battery, which results in a problem in that it may not be appropriately determined whether or not to restart the internal combustion engine.

The present invention has been made to solve such problems as described above, and an object thereof is to obtain a storage battery state detection apparatus and a storage battery state detection method, which are capable of accurately estimating the starting current ΔImax and calculating a precise starting minimum voltage, without being influenced by a change in the storage battery state or the starting state, when determination is made as to whether or not to drive the starter.

Solution to Problem

According to one embodiment of the present invention, there is provided a storage battery state detection apparatus for estimating a starting minimum voltage of a storage battery before a starter is driven and providing the starting minimum voltage to a control device, the starting minimum voltage corresponding to a voltage value at which a battery voltage of the storage battery drops to a lowest level when the starter is driven, the control device being configured to determine, when determination is made as to whether or not to drive the starter in order to start an internal combustion engine, that the starter is to be driven when the starting minimum voltage of the storage battery is equal to or higher than a threshold value that does not influence the start of the internal combustion engine, the storage battery state detection apparatus including: an internal resistance calculation unit for calculating an internal resistance of the storage battery to be used as an index of a deterioration state of the storage battery based on the battery voltage of the storage battery and a discharge current of the storage battery that are acquired while the starter is being driven; a storage unit for storing a current/voltage data set as a current/voltage correlation characteristic for each deterioration state of the storage battery classified in accordance with a magnitude of the internal resistance calculated by the internal resistance calculation unit, the current/voltage data set being formed of: a voltage immediately before the start corresponding to the battery voltage of the storage battery exhibited immediately before the starter is driven; and a measured starting current obtained by subtracting a current immediately before the start, which corresponds to the discharge current of the storage battery acquired immediately before the starter is driven, from a peak current corresponding to a maximum discharge current of the storage battery acquired while the starter is being driven; a starting current learning unit for acquiring the current/voltage data set formed of the voltage immediately before the start and the measured starting current as a measurement result each time the starter is actually driven, and updating the current/voltage correlation characteristic stored in the storage unit so as to correspond to the deterioration state classified in accordance with the magnitude of the internal resistance calculated by the internal resistance calculation unit; a starting current estimation unit for extracting, when determination is made as to whether or not to drive the starter before driving the starter, the current/voltage correlation characteristic corresponding to the deterioration state of the storage battery, which is identified by the magnitude of the internal resistance calculated by the internal resistance calculation unit at a previous time at which the starter is driven, from the storage unit, and estimating an estimated starting current corresponding to the present voltage immediately before the start of the storage battery, which has been acquired, by using the extracted current/voltage correlation characteristic; and a minimum voltage calculation unit for calculating, when determination is made as to whether or not to drive the starter, the starting minimum voltage in accordance with the following expression: (starting minimum voltage)=(voltage immediately before start)−((internal resistance)×(estimated starting current)) based on the estimated starting current that has been estimated by the starting current estimation unit, the present voltage immediately before the start of the storage battery that has been acquired, and the internal resistance of the storage battery calculated by the internal resistance calculation unit at the previous time at which the starter is driven.

Further, according to one embodiment of the present invention, there is provided a storage battery state detection method for estimating a starting minimum voltage of a storage battery before a starter is driven and providing the starting minimum voltage to a control device, the starting minimum voltage corresponding to a voltage value at which a battery voltage of the storage battery drops to a lowest level when the starter is driven, the control device being configured to determine, when determination is made as to whether or not to drive the starter in order to start an internal combustion engine, that the starter is to be driven when the starting minimum voltage of the storage battery is equal to or higher than a threshold value that does not influence the start of the internal combustion engine, the storage battery state detection method including: an internal resistance calculation step of calculating an internal resistance of the storage battery to be used as an index of a deterioration state of the storage battery based on the battery voltage of the storage battery and a discharge current of the storage battery that are acquired while the starter is being driven; a storage step of storing a current/voltage data set in a storage unit as a current/voltage correlation characteristic for each deterioration state of the storage battery classified in accordance with a magnitude of the internal resistance calculated in the internal resistance calculation step, the current/voltage data set being formed of: a voltage immediately before the start corresponding to the battery voltage of the storage battery exhibited immediately before the starter is driven; and a measured starting current obtained by subtracting a current immediately before the start, which corresponds to the discharge current of the storage battery acquired immediately before the starter is driven, from a peak current corresponding to a maximum discharge current of the storage battery acquired while the starter is being driven; a starting current learning step of acquiring the current/voltage data set formed of the voltage immediately before the start and the measured starting current as a measurement result each time the starter is actually driven, and updating the current/voltage correlation characteristic stored in the storage step in the storage unit so as to correspond to the deterioration state classified in accordance with the magnitude of the internal resistance calculated in the internal resistance calculation step; a starting current estimation step of extracting, when determination is made as to whether or not to drive the starter before driving the starter, the current/voltage correlation characteristic corresponding to the deterioration state of the storage battery, which is identified by the magnitude of the internal resistance calculated in the internal resistance calculation step at a previous time at which the starter is driven, from among the current/voltage correlation characteristics stored in the storage step in the storage unit, and estimating an estimated starting current corresponding to the present voltage immediately before the start of the storage battery, which has been acquired, by using the extracted current/voltage correlation characteristic; and a minimum voltage calculation step of calculating, when determination is made as to whether or not to drive the starter, the starting minimum voltage in accordance with the following expression: (starting minimum voltage)=(voltage immediately before start)−((internal resistance)×(estimated starting current)) based on the estimated starting current that has been estimated in the starting current estimation step, the present voltage immediately before the start of the storage battery that has been acquired, and the internal resistance of the storage battery calculated in the internal resistance calculation step at the previous time at which the starter is driven.

Advantageous Effects of Invention

According to the one embodiment of the present invention, each time the current/voltage data set obtained when the starter is driven is newly stored in association with the deterioration state of the storage battery, the storage battery state detection apparatus updates the current/voltage correlation characteristic corresponding to the deterioration state of the storage battery, and when determination is made as to whether or not to drive the starter, calculates the starting current corresponding to the present voltage immediately before the start in accordance with the current/voltage correlation characteristic corresponding to the present deterioration state of the storage battery. Thus, it is possible to obtain the storage battery state detection apparatus and the storage battery state detection method, which are capable of accurately estimating the starting current and calculating a precise starting minimum voltage, without being influenced by a change in the storage battery state or the starting state, when determination is made as to whether or not to drive the starter.

BRIEF DESCRIPTION OF DRAWINGS

FIG. 5 is a set of explanatory graphs for showing an example of maps in which a temperature and an SOC of the storage battery are associated with correction values for normalizing a measured starting current calculated by a starting current learning unit, according to the first embodiment.

FIG. 6 is a set of explanatory graphs for showing an example of maps in which the temperature and the SOC of the storage battery are associated with correction values for normalizing an internal resistance calculated by an internal resistance calculation unit, according to the first embodiment.

DESCRIPTION OF EMBODIMENTS

Figure 1:
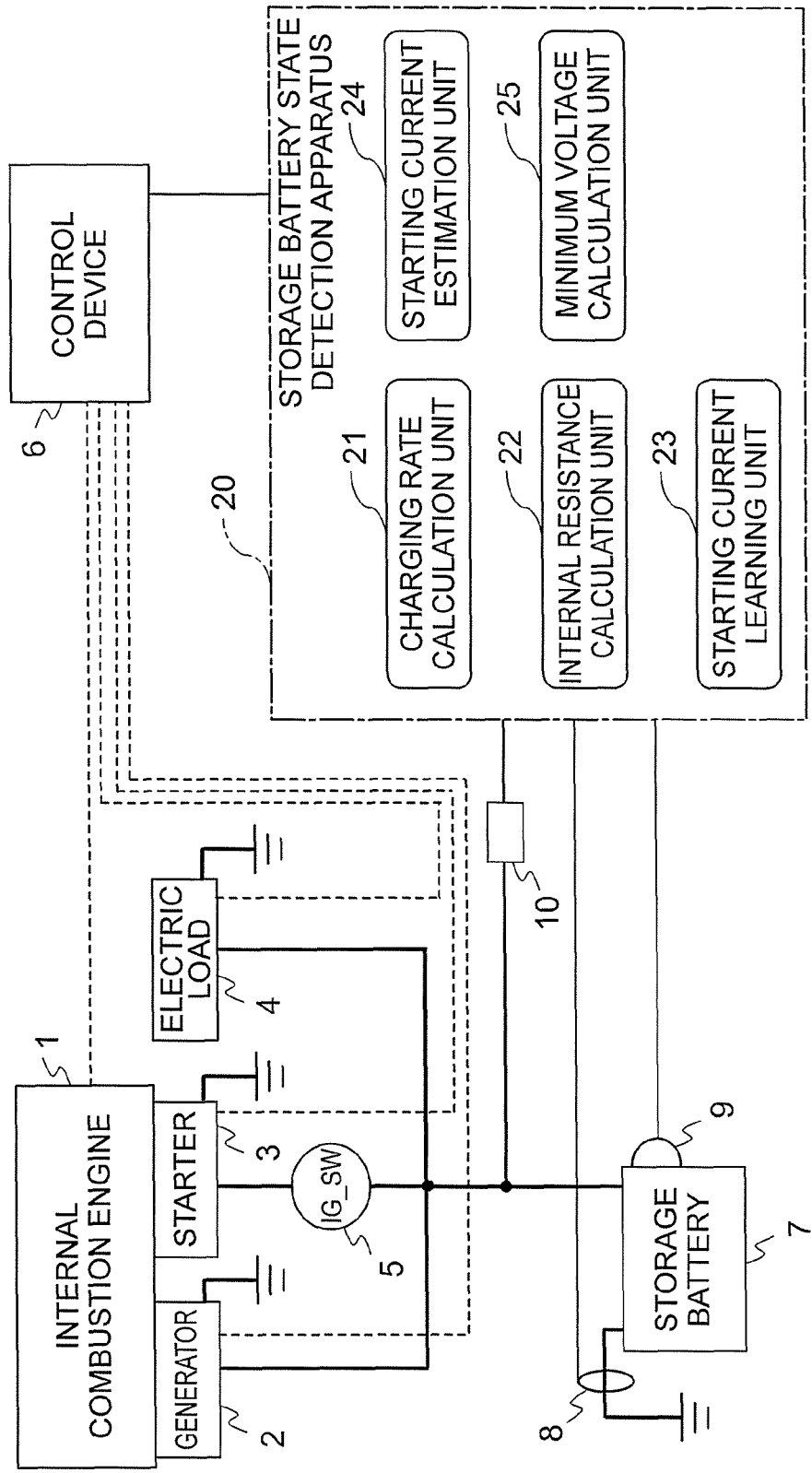
FIG. 1 is a schematic configuration diagram of an idling-stop vehicle system according to a first embodiment of the present invention.

Now, referring to the accompanying drawings, a storage battery state detection apparatus and a storage battery state detection method according to a preferred embodiment of the present invention are described. Note that, in the drawings, the same elements are denoted by the same reference symbols and a redundant description is omitted.

First Embodiment

Figure 8:
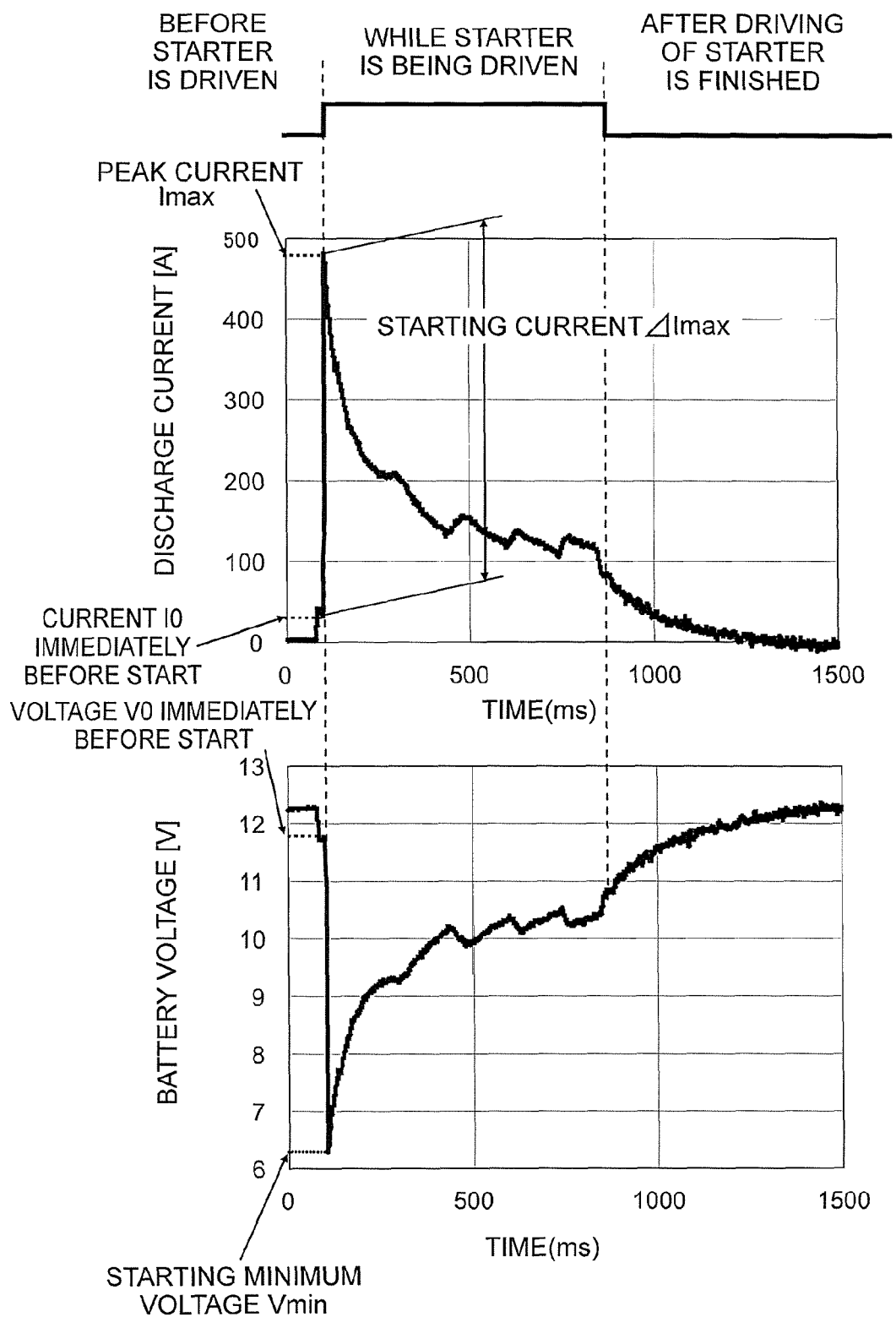
FIG. 8 is a set of explanatory graphs for showing an example of variations with time of a discharge current of the storage battery and a battery voltage thereof that are exhibited while the starter is being driven.

First, to clarify a technical feature of the present invention, the above-mentioned problems of the related art are described in detail with reference to FIG. 8. FIG. 8 is a set of explanatory graphs for showing an example of variations with time of a discharge current of a storage battery and a battery voltage thereof that are exhibited while a starter is being driven. Note that, each specific numerical value stated in FIG. 8 merely indicates an example of a value that can be taken by each parameter.

Now, a case is assumed where, in order to restart an internal combustion engine, by electrically connecting a starting load such as a starter (hereinafter referred to simply as "starter") to the storage battery, electric power is supplied from the storage battery to drive the starter.

In such case, as shown in FIG. 8, due to power consumption of the starter, the discharge current of the storage battery sharply increases immediately after the starter is driven, while the battery voltage of the storage battery sharply drops.

Specifically, within several milliseconds after the starter is driven, the discharge current changes from a current I0 immediately before the start, which is obtained immediately before the starter is driven, to a peak current Imax (maximum discharge current). Note that, the peak current Imax is determined based on a resistance of the starter, an internal resistance of the storage battery, and a wiring resistance or the like between the starter and the storage battery.

In contrast, within several milliseconds after the starter is driven, the battery voltage changes from a voltage V0 immediately before the start, which is obtained immediately before the starter is driven, to a starting minimum voltage Vmin.

Subsequently, with a lapse of time while the starter is being driven, the discharge current decreases, while the battery voltage increases. That is, with the lapse of time while the starter is being driven, a current flowing through the starter decreases, while a voltage applied to the starter increases.

Further, when a value obtained by subtracting the current I0 immediately before the start from the peak current Imax of the storage battery is defined as a starting current ΔImax, the starting current ΔImax is calculated in accordance with Expression (1).

$$\Delta I\text{max} = I\text{max} - I0 \qquad (1)$$

In addition, when an internal resistance R of the storage battery and a voltage V0 immediately before the start, which are obtained immediately before the starter is driven, and the starting current ΔImax calculated in accordance with Expression (1) are used, a starting minimum voltage Vmin of the storage battery is calculated in accordance with Expression (2).

$$Vmin = V0 - R \times \Delta Imax \quad (2)$$

Further, as described above, in the related art, in order to restart the internal combustion engine, when determination is made as to whether or not to drive the starter (before the starter is driven), the starting current ΔImax is estimated, and the starting minimum voltage Vmin is calculated in accordance with Expression (2). Then, determination is made as to whether or not to drive the starter based on the calculated starting minimum voltage Vmin.

However, as described above, the starting current ΔImax is a parameter that affects a storage battery state and a starting load state, and is difficult to estimate with precision. Further, in the related art, a detection result from a current sensor or the like is not taken into consideration, and hence it is more difficult to accurately estimate the starting current ΔImax. Therefore, the starting minimum voltage Vmin calculated by using the estimated starting current ΔImax has a large error in terms of a true value, and as a result, cannot be used to appropriately determine whether or not to drive the starter.

The inventors of the present invention have conducted an intensive research in order to solve the above-mentioned problems raised in the related art. As a result of the research, it is found that, by repeating Procedures (1) to (4) described below in order, when determination is made as to whether or not to drive the starter (before the starter is driven), the starting current ΔImax can be accurately estimated, and the precise starting minimum voltage Vmin can be calculated without being influenced by a change in the storage battery state or the starting state.

Procedure (1)

When the starter is actually driven, a current/voltage data set, which is formed of a measured starting current ΔImax1 calculated based on the discharge current of the storage battery detected while the starter is being driven and the voltage V0 immediately before the start detected immediately before the starter is driven, is stored in association with a deterioration state of the storage battery.

Procedure (2)

Each time the current/voltage data set is newly stored, a current/voltage correlation characteristic corresponding to the deterioration state of the storage battery is updated. Note that, the current/voltage correlation characteristic as used herein means a characteristic indicating a correlation between the measured starting current ΔImax1 and the voltage V0 immediately before the start.

Procedure (3)

When determination is made as to whether or not to drive the starter, an estimated starting current ΔImax2 corresponding to the present voltage V0 immediately before the start that has been detected is calculated in accordance with the current/voltage correlation characteristic corresponding to the present deterioration state of the storage battery. Further, the starting minimum voltage Vmin is calculated in accordance with Expression (2) by using the estimated starting current ΔImax2.

Procedure (4)

Determination is made as to whether or not to drive the starter based on the calculated starting minimum voltage Vmin, and when it is determined that the starter is to be driven, the processing is returned to Procedure (1).

Next, a storage battery state detection apparatus according to a first embodiment of the present invention is described with reference to FIG. 1. FIG. 1 is a schematic configuration diagram a system of a vehicle (hereinafter referred to as "idling-stop vehicle") having an idling stop control function according to the first embodiment of the present invention. Note that, the storage battery state detection apparatus according to the first embodiment is mounted on the idling-stop vehicle.

The idling-stop vehicle system illustrated in FIG. 1 includes an internal combustion engine 1, a generator 2, a starter 3, an electric load 4, an ignition switch 5, a control device 6, a storage battery 7, and a storage battery state detection apparatus 20.

A line to which the generator 2, the starter 3, the electric load 4, and the storage battery 7 are connected includes a current detection unit 8 for detecting a charge/discharge current (input/output current) of the storage battery 7 and a voltage detection unit 10 for detecting the battery voltage (inter-terminal voltage) of the storage battery 7. Note that, specific examples of the current detection unit 8 and the voltage detection unit 10 include a current sensor and a voltage sensor, but the present invention is not limited thereto.

Further, a temperature detection unit 9 for detecting a temperature (liquid temperature) of the storage battery 7 is provided near the storage battery 7. Note that, specific examples of the temperature detection unit 9 include a temperature sensor, but the present invention is not limited thereto.

The internal combustion engine 1 (for example, gasoline engine) is an apparatus for generating power for the vehicle, and has an output shaft mechanically connected to a driving wheel (not shown). The generator 2 is driven by the internal combustion engine 1 to generate electric power, and supplies the generated electric power to the electric load 4 and the storage battery 7. The storage battery 7 is charged by being supplied with the electric power from the generator 2.

Further, the starter 3 is driven by being supplied with the electric power from the storage battery 7, and starts (restarts) the internal combustion engine 1. The electric load 4 consumes the electric power supplied from the generator 2 and the storage battery 7. Note that, specific examples of the electric load 4 include vehicle electrical components such as a headlight, a room light, and an air conditioner.

The control device 6 includes an idling stop control unit (not shown). The idling stop control unit stops the internal combustion engine 1 by controlling the internal combustion engine 1 so that fuel injection through a fuel injection valve of the internal combustion engine 1 is stopped when a condition for the automatic stop is satisfied. Note that, for example, the condition for the automatic stop is satisfied when the ignition switch 5, an idle switch (not shown), and a brake switch (not shown) are in an on state, when a vehicle speed is equal to or lower than a predetermined vehicle speed, or when a rotation speed of the internal combustion engine 1 is equal to or lower than a predetermined rpm.

Further, when a condition for the restart is satisfied after the internal combustion engine 1 is stopped (the condition for the automatic stop is satisfied), the idling stop control unit drives the starter 3 to restart the internal combustion engine 1. Note that, for example, the condition for the restart is satisfied when the idle switch comes to an off state by stepping on an accelerator pedal or when the brake switch comes to an off state by canceling a brake operation.

Further, after the condition for the restart is satisfied, the idling stop control unit further determines whether or not to drive the starter 3 based on the starting minimum voltage Vmin calculated by a minimum voltage calculation unit 25 described later. Specifically, the control device 6 restarts the internal combustion engine 1 by driving the starter 3 when the condition for the restart is satisfied and when the starting minimum voltage Vmin calculated by the minimum voltage calculation unit 25 is equal to or higher than a threshold value that does not influence the restart of the internal combustion engine 1.

The storage battery state detection apparatus 20 includes a charging rate calculation unit 21, an internal resistance calculation unit 22, a starting current learning unit 23, a starting current estimation unit 24, and the minimum voltage calculation unit 25.

The charging rate calculation unit 21 calculates a state of charge (SOC: charging rate) of the storage battery 7 based on the detection result for the charge/discharge current of the storage battery 7 detected by the current detection unit 8.

The internal resistance calculation unit 22 calculates the internal resistance R of the storage battery 7 based on the detection results for the discharge current of the storage battery 7 detected by the current detection unit 8 and the battery voltage of the storage battery 7 detected by the voltage detection unit 10.

The starting current learning unit 23 calculates the starting current ΔImax of the storage battery 7 based on the detection result for the charge/discharge current of the storage battery 7 detected by the current detection unit 8. Note that, the starting current ΔImax calculated by the starting current learning unit 23 is referred to as "measured starting current ΔImax1". That is, the current I0 immediately before the start, which is detected immediately before the starter 3 is driven, is subtracted from the peak current Imax of the storage battery 7 detected while the starter 3 is being driven, to thereby calculate the measured starting current ΔImax1.

Further, when the starter 3 is driven, the starting current learning unit 23 stores the current/voltage data set, which is formed of the measured starting current ΔImax1 that has been calculated and the voltage V0 immediately before the start detected by the voltage detection unit 10 immediately before the starter 3 is driven, in a storage unit (not shown) in association with the deterioration state of the storage battery 7. Further, each time the starting current learning unit 23 newly stores the current/voltage data set, the starting current learning unit 23 updates the current/voltage correlation characteristic corresponding to the deterioration state of the storage battery 7. Note that, the current/voltage correlation characteristic as used herein means the characteristic indicating the correlation between the measured starting current ΔImax1 and the voltage V0 immediately before the start.

When determination is made as to whether or not to drive the starter 3, the starting current estimation unit 24 selects (extracts) the current/voltage correlation characteristic corresponding to the present deterioration state of the storage battery 7 from among the current/voltage correlation characteristics updated by the starting current learning unit 23. Further, in accordance with the selected current/voltage correlation characteristic, the starting current estimation unit 24 calculates (estimates) the starting current ΔImax corresponding to the present voltage V0 immediately before the start detected by the voltage detection unit 10. Note that, the starting current ΔImax calculated by the starting current estimation unit 24 is referred to as "estimated starting current ΔImax2".

The minimum voltage calculation unit 25 calculates the starting minimum voltage Vmin in accordance with Expression (2) by using the present voltage V0 immediately before the start detected by the voltage detection unit 10, the internal resistance R calculated by the internal resistance calculation unit 22, and the estimated starting current ΔImax2 calculated by the starting current estimation unit 24. Then, the control device 6 determines whether or not to drive the starter 3 based on the starting minimum voltage Vmin.

Figure 2:
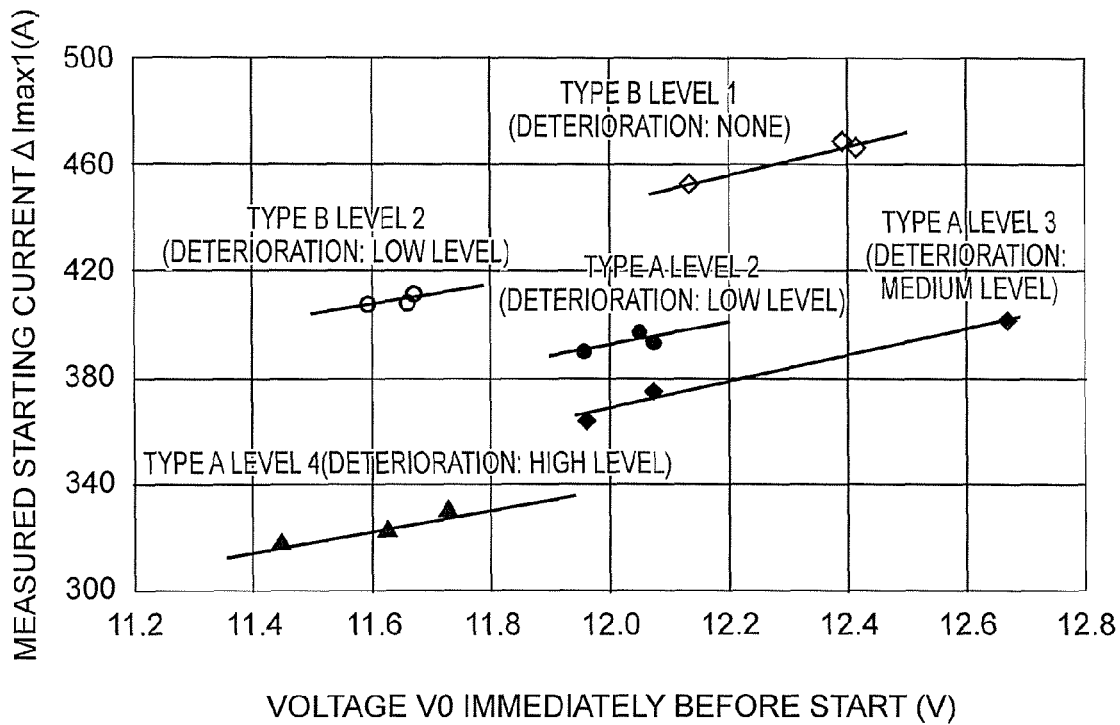
FIG. 2 is an explanatory graph for showing an example of a current/voltage correlation characteristic according to the first embodiment of the present invention.
Figure 3:
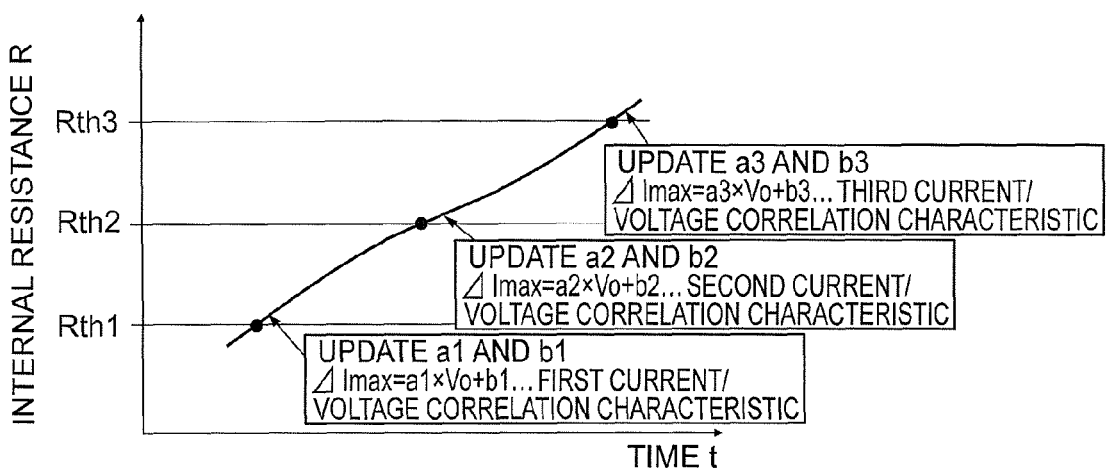
FIG. 3 is an explanatory graph for showing a case where a starting current estimation unit selects the current/voltage correlation characteristic in accordance with a deterioration state of the storage battery, according to the first embodiment of the present invention.

Next, operations of the starting current learning unit 23 and the starting current estimation unit 24 according to the first embodiment are described in detail with reference to FIG. 2 and FIG. 3. FIG. 2 is an explanatory graph for showing an example of the current/voltage correlation characteristic according to the first embodiment of the present invention. FIG. 3 is an explanatory graph for showing a case where the starting current estimation unit selects the current/voltage correlation characteristic in accordance with the deterioration state of the storage battery 7, according to the first embodiment of the present invention.

In FIG. 2, a graph is shown having a horizontal axis representing the voltage V0 immediately before the start (V) and a vertical axis representing the measured starting current ΔImax1 (A) on which the current/voltage correlation characteristics of five patterns described below are indicated so as to correspond to the kinds and deterioration states of the storage battery 7. Note that, each specific numerical value stated in FIG. 2 merely indicates an example of a value that can be taken by each parameter.

Further, the measured starting current ΔImax1 corresponding to each plot within FIG. 2 is normalized based on a correction value corresponding to the temperature and the SOC of the storage battery exhibited when the peak current Imax and the current I0 immediately before the start are detected. The normalization is described later in detail. Note that, the temperature and the SOC of the storage battery exhibited when the peak current Imax and the current I0 immediately before the start are detected are equivalent between the plots of the same kind within FIG. 2.

Further, the kind of the storage battery and the deterioration state of the storage battery corresponding to each of the current/voltage correlation characteristics of the five patterns are as follows. Note that, each of the deterioration states of the storage battery is indicated by four levels. No deterioration is exhibited at Level 1, and as the level becomes higher, a degree of deterioration becomes higher (Level 4 indicates the highest degree of deterioration).

Pattern 1 (corresponding to the plot of the black triangle in FIG. 2)
Kind of the storage battery: Type A; deterioration state of the storage battery: Level 4 (deterioration: high level)
Pattern 2 (corresponding to the plot of the black rhombus in FIG. 2)
Kind of the storage battery: Type A; deterioration state of the storage battery: Level 3 (deterioration: medium level)
Pattern 3 (corresponding to the plot of the black circle in FIG. 2)
Kind of the storage battery: Type A; deterioration state of the storage battery: Level 2 (deterioration: low level)
Pattern 4 (corresponding to the plot of the white circle in FIG. 2)
Kind of the storage battery: Type B; deterioration state of the storage battery: Level 2 (deterioration: low level)
Pattern 5 (corresponding to the plot of the white rhombus in FIG. 2)

Kind of the storage battery: Type B; deterioration state of the storage battery: Level 1 (deterioration: none)

As shown in FIG. 2, in each of the five patterns, as the voltage V0 immediately before the start becomes higher, the measured starting current ΔImax1 becomes larger. Further, for example, when the plots corresponding to each pattern is approximated by a linear expression, it is possible to confirm such a correlation that the measured starting current ΔImax1 becomes larger in proportion to a magnitude of the voltage V0 immediately before the start. Note that, in FIG. 2, a case is exemplified where those plots are approximated by a linear expression, but the present invention is not limited to linear approximation, and the plots may be approximated in any manner as long as the correlation can be confirmed.

In this manner, the current/voltage correlation characteristic of the measured starting current ΔImax1 and the voltage V0 immediately before the start changes depending on the kind and the deterioration state of the storage battery change. Then, such a current/voltage correlation characteristic corresponds to the deterioration, stratification polarization, and charging/discharging polarization of the storage battery.

Therefore, by using such a characteristic, the starting current learning unit 23 stores one current/voltage data set obtained when the starter 3 is driven one time in association with the deterioration state of the storage battery 7, and updates the current/voltage correlation characteristic corresponding to the deterioration state. Thus, there exist the current/voltage correlation characteristics of a plurality of patterns corresponding to the deterioration states of the storage battery 7.

Further, as an example in which the starting current learning unit 23 detects the deterioration state of the storage battery 7, the deterioration state of the storage battery 7 may be detected by using the internal resistance R calculated by the internal resistance calculation unit 22 as an index.

Specifically, for example, as shown in FIG. 3, internal resistance threshold values Rth1, Rth2, and Rth3 of the storage battery 7 are defined in advance so as to correspond to the deterioration states of the storage battery 7. Note that, the internal resistance threshold values Rth1, Rth2, and Rth3 correspond to the degrees of deterioration of the storage battery 7, and the degree of deterioration of the storage battery 7 becomes larger as the internal resistance threshold value becomes larger. Then, based on a range of values that can be taken by the internal resistance R, the deterioration states of the storage battery 7 are defined as follows.

Case of Rth1≤R<Rth2: Level 2 (deterioration: low level)
Case of Rth2≤R<Rth3: Level 3 (deterioration: medium level)
Case of Rth3≤R: Level 4 (deterioration: high level)

Now, a case is assumed where, when determination is made as to whether or not to drive the starter 3, for example, the relationship of Rth1≤R<Rth2 is satisfied by using, as the present internal resistance R, the internal resistance R of the storage battery 7 calculated by the internal resistance calculation unit 22 when the starter 3 is driven at the previous time.

In this case, when the starter 3 is actually driven by the determination as to whether or not to drive the starter 3, the starting current learning unit 23 newly stores one current/voltage data set, and updates the current/voltage correlation characteristic in which the deterioration state of the storage battery 7 corresponds to Level 2 (hereinafter referred to as "first current/voltage correlation characteristic").

Specifically, for example, the first current/voltage correlation characteristic subjected to the linear approximation is expressed by a relational expression such as Expression (3). Note that, in FIG. 3, the relational expression of Expression (3) is exemplified.

$$\Delta I\max = a1 \times V0 + b1 \text{ (where } a1 \text{ and } b1 \text{ represent constants)} \quad (3)$$

Then, the starting current learning unit 23 newly stores one current/voltage data set, to thereby increase a data count thereof for the first current/voltage correlation characteristic, which causes the first current/voltage correlation characteristic to change. Therefore, the starting current learning unit 23 updates the first current/voltage correlation characteristic, to thereby conduct approximation again. That is, the starting current learning unit 23 newly updates the constants a1 and b1 within Expression (3) each time the current/voltage data set is newly stored.

Further, when determination is made as to whether or not to drive the starter 3, the starting current estimation unit 24 selects the first current/voltage correlation characteristic in which the deterioration state of the storage battery 7 corresponds to Level 2, and calculates the estimated starting current ΔImax2 in accordance with the selected first current/voltage correlation characteristic.

Specifically, when determination is made as to whether or not to drive the starter 3, the starting current estimation unit 24 substitutes the present voltage V0 immediately before the start of the storage battery 7 into Expression (3), to thereby calculate the estimated starting current ΔImax2.

Further, the internal resistance R of the storage battery 7 becomes higher as the deterioration of the storage battery 7 progresses with the lapse of time, and hence the deterioration state of the storage battery 7 changes from Level 2 to Level 3 and Level 4 in the stated order. In such a case, the starting current learning unit 23 and the starting current estimation unit 24 conduct the same operation as that conducted when the deterioration state of the storage battery 7 is Level 2.

That is, when the starter 3 is driven, each time the starting current learning unit 23 newly stores one current/voltage data set, the starting current learning unit 23 updates the current/voltage correlation characteristic corresponding to the deterioration state of the storage battery 7. Specifically, as shown in FIG. 3, each time the current/voltage data set is newly stored, constants a2 and b2 are updated when the deterioration state of the storage battery 7 is Level 3, and constants a3 and b3 are updated when the deterioration state is Level 4. Further, when determination is made as to whether or not to drive the starter 3, the starting current estimation unit 24 calculates the estimated starting current ΔImax2 in accordance with the current/voltage correlation characteristic corresponding to the deterioration state of the storage battery 7.

In this manner, even when the deterioration state of the storage battery 7 changes over time, the starting current learning unit 23 can store the current/voltage data set in the storage unit as the current/voltage correlation characteristic for each deterioration state classified in accordance with the magnitude of the internal resistance of the storage battery 7, and also updates the current/voltage correlation characteristic corresponding to the deterioration state. Further, the starting current estimation unit 24 calculates the estimated starting current ΔImax2 in accordance with the correlation function corresponding to the deterioration state of the storage battery 7. Thus, when determination is made as to whether or not to drive the starter 3, it is possible to accurately estimate the starting current ΔImax.

Note that, a case where it is first determined whether or not to drive the starter 3 means that the starter has never been driven, and that the starting current learning unit 23 has not yet stored a current/voltage data set in the storage unit. Therefore, when it is first determined whether or not to drive the starter 3, it suffices that the storage unit stores the current/voltage correlation characteristic (correlation function) corresponding to the deterioration state of the storage battery 7, which is defined in advance, and the starting current estimation unit 24 calculates in accordance with the correlation function.

Further, when the starter 3 is driven, the starting current learning unit 23 may constantly keep storing the current/voltage data set, to thereby increase the data count thereof for the current/voltage correlation characteristic, or may be inhibited from storing the current/voltage data set after storing the current/voltage data sets by a predetermined data count.

Further, it suffices that there are at least two current/voltage data sets for each current/voltage correlation characteristic corresponding to the deterioration state of the storage battery 7. In that case, for example, the relational expression can be derived by the linear approximation as in Expression (3), and the estimated starting current ΔImax2 can be calculated. Further, in order to further increase the accuracy of the estimated starting current ΔImax2, for example, it is preferred that there be twenty or more current/voltage data sets for each current/voltage correlation characteristic corresponding to the deterioration state of the storage battery 7.

Next, a series of operations conducted by the storage battery state detection apparatus 20 according to the first embodiment is described with reference to flowcharts of FIG. 4 and FIG. 7.

Figure 4:
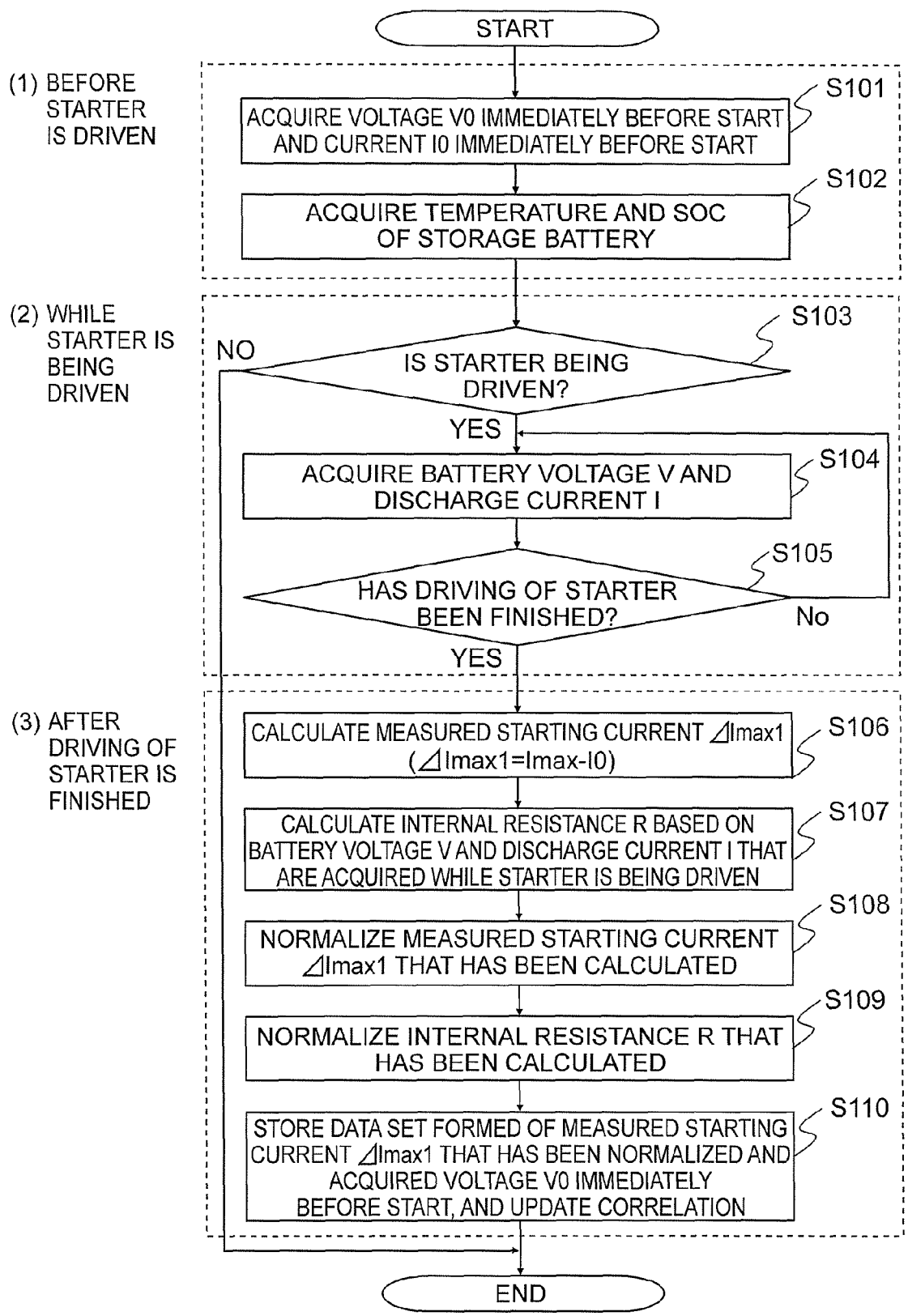
FIG. 4 is a flowchart for illustrating a procedure of an operation for updating, by a storage battery state detection apparatus according to the first embodiment of the present invention, the current/voltage correlation characteristic corresponding to the deterioration state of the storage battery.

First, the flowchart of FIG. 4 is described. FIG. 4 is a flowchart for illustrating a procedure of an operation for updating, by the storage battery state detection apparatus 20 according to the first embodiment of the present invention, the current/voltage correlation characteristic corresponding to the deterioration state of the storage battery 7.

Note that, the processing of Steps S101 and S102 are executed before the starter 3 is driven, the processing of Steps S103 to S105 are executed while the starter 3 is being driven, and the processing of Steps S106 to S110 are executed after the driving of the starter 3 is finished.

In Step S101, the starting current learning unit 23 within the storage battery state detection apparatus 20 acquires the voltage V0 immediately before the start, which is a detection value of the voltage detection unit 10, and the current I0 immediately before the start, which is a detection value of the current detection unit 8. Note that, each of the voltage V0 immediately before the start and the current I0 immediately before the start, which are acquired by the starting current learning unit 23, may be an instantaneous value obtained immediately before the starter 3 is driven, or may be a mean value during a desired period from a time before the starter 3 is driven until the time immediately before the starter 3 is driven.

Subsequently, in Step S102, the starting current learning unit 23 acquires the temperature of the storage battery 7, which is a detection value of the temperature detection unit 9, and the SOC of the storage battery 7 calculated by the charging rate calculation unit 21. Further, the internal resistance calculation unit 22 also acquires the temperature and the SOC of the storage battery 7 in the same manner as the starting current learning unit 23.

Note that, each of the temperature and the SOC of the storage battery 7 acquired by the starting current learning unit 23 and the internal resistance calculation unit 22 may be an instantaneous value obtained immediately before the starter 3 is driven, or may be a mean value during the desired period from the time before the starter 3 is driven until the time immediately before the starter 3 is driven.

In this manner, the storage battery state detection apparatus 20 executes the processing of Steps S101 and S102 before the control device 6 drives the starter 3. Note that, when the starter 3 is driven, as shown in FIG. 8, a large current (cranking current) that sharply increases is caused to flow into the starter 3 from the storage battery 7.

Subsequently, in Step S103, the starting current learning unit 23 determines whether or not the starter 3 is being driven. Specifically, for example, determination is made as to whether or not the starter 3 is being driven based on the detection result from the current detection unit 8.

When determining in Step S103 that the starter 3 is being driven (that is, YES), the starting current learning unit 23 proceeds to Step S104. On the other hand, when determining in Step S103 that the starter 3 is not being driven (that is, NO), the starting current learning unit 23 ends the series of processing.

Subsequently, in Step S104, the starting current learning unit 23 acquires a desired number of sets of a discharge current I and a battery voltage V of the storage battery 7 exhibited while the starter 3 is being driven in association with each other for each desired time period (for example, every millisecond), and stores the same as a first table. Note that, a set of the peak current Imax and the starting minimum voltage Vmin acquired from the voltage detection unit 10 and the current detection unit 8 is also stored in the first table.

Subsequently, in Step S105, the starting current learning unit 23 determines whether or not the driving of the starter 3 has been finished. Specifically, for example, determination is made as to whether or not the driving of the starter 3 has been finished based on the detection result from the current detection unit 8.

When determining in Step S105 that the driving of the starter 3 has been finished (that is, YES), the starting current learning unit 23 proceeds to Step S106. On the other hand, when determining in Step S105 that the driving of the starter 3 has not been finished (that is, NO), the starting current learning unit 23 returns to Step S104, to execute the processing of Step S104 again.

In this manner, the storage battery state detection apparatus 20 executes the processing of Steps S103 to S105 while the starter 3 is being driven after the ignition switch 5 is turned on.

Subsequently, in Step S106, the starting current learning unit 23 selects the peak current Imax from the first table stored in Step S105. In addition, in Step S106, the starting current learning unit 23 subtracts the current I0 immediately before the start, which is acquired in Step S101, from the selected peak current Imax, to thereby calculate the measured starting current ΔImax1 (ΔImax1=Imax−I0).

Subsequently, in Step S107, the internal resistance calculation unit 22 within the storage battery state detection apparatus 20 calculates the internal resistance R of the storage battery 7 based on the first table stored by the starting current learning unit 23. Specifically, for example, each set of the discharge current and the battery voltage of the storage battery 7 within the first table is plotted on a graph having a horizontal axis representing the discharge current I and a vertical axis representing the battery voltage V. Further, an inclination of a linear straight line obtained by approximating the plots by a linear expression corresponds to the internal resistance R.

Subsequently, in Step S108, the starting current learning unit 23 normalizes the measured starting current ΔImax1 calculated in Step S106 based on the correction values corresponding to the temperature and the SOC of the storage battery 7 acquired in Step S102.

Now, the normalization of the measured starting current ΔImax1 is specifically described with reference to FIG. 5. FIG. 5 is a set of explanatory graphs for showing an example of maps in which the temperature and the SOC of the storage battery 7 are associated with the correction values for normalizing the measured starting current ΔImax1 calculated by the starting current learning unit 23, according to the first embodiment.

In general, the discharge current of the storage battery 7 differs depending on the temperature and the SOC of the storage battery 7. Further, as the temperature and the SOC of the storage battery 7 become higher, the internal resistance R of the storage battery 7 becomes lower, which facilitates the flow of the discharge current. Therefore, the peak current Imax and the current I0 immediately before the start detected by the current detection unit 8 (measured starting current ΔImax1 calculated by the starting current learning unit 23) include influences of the temperature and the SOC of the storage battery 7. Therefore, in order to eliminate those influences, the measured starting current ΔImax1 calculated by the starting current learning unit 23 needs to be normalized by being converted into a reference temperature and a reference SOC of the storage battery 7.

Specifically, in accordance with the maps shown in FIG. 5, the starting current learning unit 23 selects a first starting current correction value corresponding to the temperature of the storage battery 7 acquired in Step S102 and a second starting current correction value corresponding to the SOC of the storage battery 7 acquired in Step S102. Then, the starting current learning unit 23 subtracts the first starting current correction value and the second starting current correction value, which have been selected, from the calculated measured starting current ΔImax1, to thereby obtain the measured starting current ΔImax1 that has been normalized. The measured starting current ΔImax1 that has been normalized is obtained by being converted into the reference temperature and the reference SOC of the storage battery 7.

Note that, the maps in which the temperature and the SOC of the storage battery 7 are associated with the correction values for normalizing the measured starting current ΔImax1 calculated by the starting current learning unit 23 may be defined in advance in accordance with the characteristic of the storage battery 7 after determining specific numerical values of the reference temperature and the reference SOC of the storage battery 7.

Subsequently, in Step S109, the internal resistance calculation unit 22 normalizes the internal resistance R calculated in Step S107 based on correction values corresponding to the temperature and the SOC of the storage battery 7 acquired in Step S102.

Now, the normalization of the internal resistance R is specifically described with reference to FIG. 6. FIG. 6 is a set of explanatory graphs for showing an example of maps in which the temperature and the SOC of the storage battery 7 are associated with the correction values for normalizing the internal resistance R calculated by the internal resistance calculation unit 22, according to the first embodiment.

In general, as described above, the internal resistance of the storage battery 7 differs depending on the temperature and the SOC of the storage battery 7. Further, as the temperature and the SOC of the storage battery 7 become higher, the internal resistance R of the storage battery 7 becomes lower. Therefore, the internal resistance R calculated by the internal resistance calculation unit 22 includes influences of the temperature and the SOC of the storage battery 7. Therefore, in order to eliminate those influences, the internal resistance R calculated by the internal resistance calculation unit 22 needs to be normalized by being converted into the reference temperature and the reference SOC of the storage battery 7.

Specifically, in accordance with the maps shown in FIG. 6, the internal resistance calculation unit 22 selects a first internal resistance correction value corresponding to the temperature of the storage battery 7 acquired in Step S102 and a second internal resistance correction value corresponding to the SOC of the storage battery 7 acquired in Step S102. Then, the internal resistance calculation unit 22 adds the first internal resistance correction value and the second internal resistance correction value, which have been selected, to the calculated internal resistance R, to thereby obtain the internal resistance R that has been normalized. The internal resistance R that has been normalized is obtained by being converted into the reference temperature and the reference SOC of the storage battery 7.

Note that, the maps in which the temperature and the SOC of the storage battery 7 are associated with the correction values for normalizing the internal resistance R calculated by the internal resistance calculation unit 22 may be defined in advance in accordance with the characteristic of the storage battery 7 after determining the specific numerical values of the reference temperature and the reference SOC of the storage battery 7.

Subsequently, in Step S110, the starting current learning unit 23 stores the current/voltage data set formed of the measured starting current ΔImax1 normalized in Step S108 and the voltage V0 immediately before the start of the storage battery 7 acquired in Step S101. Note that, specifically, the current/voltage data set is stored in a rewritable storage unit such as a RAM. In addition, in Step S110, the starting current learning unit 23 updates the current/voltage correlation characteristic corresponding to the deterioration state of the storage battery 7 based on the stored current/voltage data set.

Figure 7:
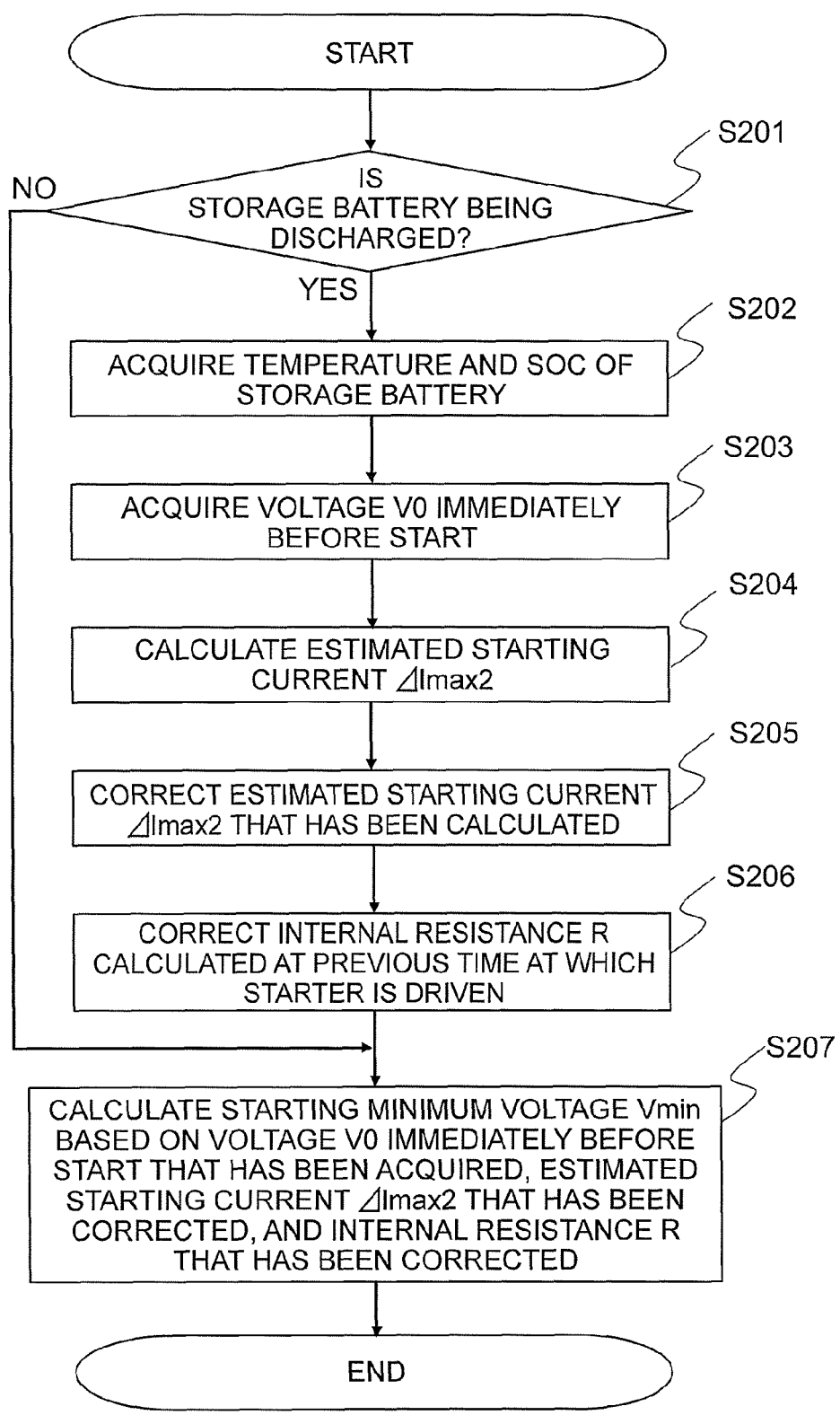
FIG. 7 is a flowchart for illustrating a procedure of an operation for calculating, by the storage battery state detection apparatus according to the first embodiment of the present invention, a starting minimum voltage Vmin in accordance with the current/voltage correlation characteristic when determination is made as to whether or not to drive the starter.

Next, the flowchart of FIG. 7 is described. FIG. 7 is a flowchart for illustrating a procedure of an operation for calculating, by the storage battery state detection apparatus 20 according to the first embodiment of the present invention, the starting minimum voltage Vmin in accordance with the current/voltage correlation characteristic when determination is made as to whether or not to drive the starter 3.

In Step S201, the starting current estimation unit 24 within the storage battery state detection apparatus 20 determines whether or not the storage battery 7 is being discharged. Specifically, for example, determination is made as to whether or not the storage battery 7 is being discharged based on the detection result from the current detection unit 8. Further, the storage battery 7 is discharged when the generator 2 stops generating electric power, when the internal combustion engine 1 stops being driven, when the idling stop thereof is effected, or in another such case.

When determining in Step S201 that the storage battery 7 is being discharged (that is, YES), the starting current estimation unit 24 proceeds to Step S202. On the other hand, when determining in Step S201 that the storage battery 7 is not being discharged (that is, NO), the starting current estimation unit 24 proceeds to Step S207.

Subsequently, in Step S202, the starting current estimation unit 24 acquires the temperature of the storage battery 7, which is the detection value of the temperature detection unit 9, and the SOC of the storage battery 7 calculated by the charging rate calculation unit 21. Further, the internal resistance calculation unit 22 also acquires the temperature and the SOC of the storage battery 7 in the same manner as the starting current estimation unit 24.

Note that, each of the temperature and the SOC of the storage battery 7 acquired by the starting current estimation unit 24 and the internal resistance calculation unit 22 may be an instantaneous value obtained immediately before the starter 3 is driven, or may be a mean value during the desired period from the time before the starter 3 is driven until the time immediately before the starter 3 is driven.

Subsequently, in Step S203, the starting current estimation unit 24 acquires the voltage V0 immediately before the start, which is the detection value of the voltage detection unit 10. Note that, the voltage V0 immediately before the start acquired by the starting current estimation unit 24 may be an instantaneous value obtained immediately before the starter 3 is driven, or may be a mean value during the desired period from the time before the starter 3 is driven until the time immediately before the starter 3 is driven.

Subsequently, in Step S204, the starting current estimation unit 24 calculates the estimated starting current $\Delta Imax2$ corresponding to the voltage V0 immediately before the start acquired in Step S203 in accordance with the current/voltage correlation characteristic corresponding to the deterioration state of the storage battery 7. Note that, for example, based on the internal resistance R of the storage battery 7 calculated by the internal resistance calculation unit 22 at the previous time at which the starter 3 is driven, the starting current estimation unit 24 determines the deterioration state of the storage battery 7.

Subsequently, in Step S205, the starting current estimation unit 24 corrects the estimated starting current $\Delta Imax2$ calculated in Step S204 based on the correction values corresponding to the temperature and the SOC of the storage battery 7 acquired in Step S202.

In this case, in the current/voltage correlation characteristic corresponding to the deterioration state of the storage battery 7, the starting current $\Delta Imax$ normalized in Step S106 is associated with the voltage V0 immediately before the start, and hence in Step S204, the estimated starting current $\Delta Imax2$ that has been normalized is calculated. Therefore, the normalization needs to be restored to an original point so that the estimated starting current $\Delta Imax2$ that has been normalized corresponds to the present temperature and the present SOC of the storage battery 7 acquired in Step S202.

Specifically, based on the maps shown in FIG. 5, the starting current estimation unit 24 selects the first starting current correction value corresponding to the temperature of the storage battery 7 acquired in Step S202 and the second starting current correction value corresponding to the SOC of the storage battery 7 acquired in Step S202. Then, the starting current estimation unit 24 adds the selected first starting current value and the selected second starting current value to the estimated starting current $\Delta Imax2$ calculated in Step S204, to thereby obtain the estimated starting current $\Delta Imax2$ that has been corrected. The estimated starting current $\Delta Imax2$ that has been corrected is obtained by being converted into the temperature and the SOC of the storage battery 7 acquired in Step S202.

Subsequently, in Step S206, the internal resistance calculation unit 22 corrects the internal resistance R of the storage battery 7 calculated by the internal resistance calculation unit 22 at the previous time at which the starter 3 is driven based on the correction values corresponding to the temperature and the SOC of the storage battery 7 acquired in Step S202.

In this case, the internal resistance R calculated in Step S107 at the previous time at which the starter 3 is driven is further normalized in Step S109. Therefore, the normalization needs to be restored to an original point so that the internal resistance R that has been normalized corresponds to the present temperature and the present SOC of the storage battery 7 acquired in Step S202.

Specifically, based on the maps shown in FIG. 6, the internal resistance calculation unit 22 selects the first internal resistance correction value corresponding to the temperature of the storage battery 7 acquired in Step S202 and the second internal resistance correction value corresponding to the SOC of the storage battery 7 acquired in Step S202. Then, the internal resistance calculation unit 22 subtracts the selected first internal resistance correction value and the selected second internal resistance correction value from the internal resistance R normalized in Step S109, to thereby obtain the internal resistance R that has been corrected. The internal resistance R that has been corrected is obtained by being converted into the temperature and the SOC of the storage battery 7 acquired in Step S202.

Subsequently, in Step S207, the minimum voltage calculation unit 25 within the storage battery state detection apparatus 20 calculates the starting minimum voltage Vmin in accordance with Expression (2) based on the voltage V0 immediately before the start acquired in Step S203, the estimated starting current $\Delta Imax2$ corrected in Step S205, and the internal resistance R corrected in Step S206.

As described above, according to the first embodiment, each time the storage battery state detection apparatus newly stores the current/voltage data set obtained when the starter is driven in association with the deterioration state of the storage battery, the storage battery state detection apparatus updates the current/voltage correlation characteristic corresponding to the deterioration state of the storage battery. Further, when determination is made as to whether or not to drive the starter, the storage battery state detection apparatus calculates the estimated starting current corresponding to the present voltage immediately before the start in accordance with the current/voltage correlation characteristic corresponding to the present deterioration state of the storage battery.

Thus, the starting current can be accurately estimated without being influenced by the change in the storage battery state and the starting state, with the result that a precise starting minimum voltage can be calculated. Further, the calculated starting minimum voltage is high in reliability, and hence the control device appropriately determines whether or not to drive the starter, with the result that a fuel consumption amount of the internal combustion engine can be further reduced. Further, as the starting current of the current/voltage data set, the measured starting current calculated based on the discharge current detected directly by the current detection unit is used instead of the estimated starting current, and hence sufficiently high estimation accuracy can be ensured in the estimation of the starting current.

Further, the present invention can be applied to related-art methods of inhibiting the idling stop and of canceling the idling stop, which can produce the same effects.

Note that, the first embodiment exemplifies the case where the measured starting current $\Delta Imax1$ and the internal resistance R are normalized, but a fixed effect can be obtained without conducting the above-mentioned normalization processing. That is, the above-mentioned normalization processing serves to suppress the influence of differences in the temperature and the charging rate of the storage battery exhibited when learning data is generated and estimation data is calculated, and is processing conducted to estimate the estimated starting current ΔImax2 further accurately by using the current/voltage correlation characteristic and to further accurately calculate the internal resistance R. Therefore, it is possible to estimate the starting current more accurately than the related art without conducting the above-mentioned normalization processing, which allows the precise starting minimum voltage to be calculated. Further, when the above-mentioned normalization processing is not conducted, it is not necessary to conduct the processing for restoring the normalization to the original point.

Further, the first embodiment exemplifies the case where the deterioration state of the storage battery 7 is detected by using the internal resistance R calculated by the internal resistance calculation unit 22 as the index, but the present invention is not limited thereto, and the deterioration state of the storage battery 7 may be detected by using the parameter other than the internal resistance R as an index of the deterioration state or using another such known technology.

Further, the present invention is not limited to contents described in the first embodiment, and may be therefore carried out by being modified as follows. Further, exemplary methods described below may be combined arbitrarily.

In the first embodiment, the internal resistance R is calculated based on the association between the desired number of sets of the battery voltage and the discharge current of the storage battery 7 acquired for each desired time period, but the present invention is not limited thereto. That is, the internal resistance R may be calculated based on the association between the battery voltage and the discharge current of the storage battery 7 that are acquired at all times.

The first embodiment exemplifies the case where the starting current learning unit 23 mathematize the correlation among a plurality of current/voltage data sets that have been stored by conducting the linear approximation (linear approximation), but an approximation method is not limited thereto. That is, any approximation method such as secondary approximation or polynomial expression approximation may be used as long as the estimated starting current ΔImax2 can be calculated in accordance with the correlation.

In the first embodiment, the starting current learning unit 23 may be configured to store a desired number of the current/voltage data sets, and after the desired number of the current/voltage data sets are stored, replace the oldest current/voltage data set by the latest current/voltage data set for the storing. For example, assuming that the desired number is twenty, to store the twenty-first current/voltage data set, the current/voltage data set stored first is replaced by the twenty-first current/voltage data set for the storing.

In the first embodiment, the starting current learning unit 23 may be configured to update the current/voltage correlation characteristic by using n+1 (n represents an integer of 1 or larger) current/voltage data sets that have been stored in time series since n times before until the latest current/voltage data set.

In the first embodiment, the current/voltage correlation characteristic may be updated by weighting the current/voltage data sets stored in time series in accordance with a time difference from the present time. For example, by weighting the latest current/voltage data set, it is assumed that there are three current/voltage data sets, to update the current/voltage correlation characteristic. Further, a timing to weight the current/voltage data set may be set to before the starting current learning unit 23 stores the current/voltage data set or when the current/voltage correlation characteristic is updated after being stored.

In the first embodiment, the voltage V0 immediately before the start within the current/voltage data set may be normalized in the same manner as the measured starting current ΔImax1 based on the correction value corresponding to the temperature and the SOC of the storage battery 7 or the correction value corresponding to any one thereof. Further, when the voltage V0 immediately before the start is normalized, the starting minimum voltage Vmin may be calculated after the normalization is restored to the original point so as to correspond to the present temperature or the present SOC of the storage battery 7.

The invention claimed is:

1. A storage battery state detection apparatus for estimating a starting minimum voltage of a storage battery before a starter is driven and providing the starting minimum voltage to a control device, the starting minimum voltage corresponding to a voltage value at which a battery voltage of the storage battery drops to a lowest level when the starter is driven, the control device being configured to determine, when determination is made as to whether or not to drive the starter in order to start an internal combustion engine, that the starter is to be driven when the starting minimum voltage of the storage battery is equal to or higher than a threshold value that does not influence the start of the internal combustion engine, the storage battery state detection apparatus comprising:
an internal resistance calculation unit for calculating an internal resistance of the storage battery to be used as an index of a deterioration state of the storage battery based on the battery voltage of the storage battery and a discharge current of the storage battery that are acquired while the starter is being driven;

a storage unit for storing a current/voltage data set as a current/voltage correlation characteristic for each deterioration state of the storage battery classified in accordance with a magnitude of the internal resistance calculated by the internal resistance calculation unit, the current/voltage data set being formed of:
a voltage immediately before the start corresponding to the battery voltage of the storage battery exhibited immediately before the starter is driven; and
a measured starting current obtained by subtracting a current immediately before the start, which corresponds to the discharge current of the storage battery acquired immediately before the starter is driven, from a peak current corresponding to a maximum discharge current of the storage battery acquired while the starter is being driven;

a starting current learning unit for acquiring the current/voltage data set formed of the voltage immediately before the start and the measured starting current as a measurement result each time the starter is actually driven, and updating the current/voltage correlation characteristic stored in the storage unit so as to correspond to the deterioration state classified in accordance with the magnitude of the internal resistance calculated by the internal resistance calculation unit;

a starting current estimation unit for extracting, when determination is made as to whether or not to drive the starter before driving the starter, the current/voltage correlation characteristic corresponding to the deterioration state of the storage battery, which is identified by the magnitude of the internal resistance calculated by the internal resistance calculation unit at a previous time at which the starter is driven, from the storage unit, and estimating an estimated starting current corresponding to the present voltage immediately before the start of the storage battery, which has been acquired, by using the extracted current/voltage correlation characteristic; and a minimum voltage calculation unit for calculating, when determination is made as to whether or not to drive the starter, the starting minimum voltage in accordance with the following expression:

(starting minimum voltage)=(voltage immediately before start)−((internal resistance)×(estimated starting current))

based on the estimated starting current that has been estimated by the starting current estimation unit, the present voltage immediately before the start of the storage battery that has been acquired, and the internal resistance of the storage battery calculated by the internal resistance calculation unit at the previous time at which the starter is driven.

2. A storage battery state detection apparatus according to claim 1, further comprising:

a charging rate calculation unit for calculating a charging rate of the storage battery based on a detection result for a charge/discharge current of the storage battery; and a temperature detection unit for detecting a temperature of the storage battery, wherein:

the starting current learning unit acquires, when the current/voltage data set is to be stored, the charging rate and the temperature of the storage battery from the charging rate calculation unit and the temperature detection unit, respectively, normalizes the measured starting current within the current/voltage data set based on correction values corresponding to the charging rate and the temperature of the storage battery that have been acquired, and stores the normalized measured starting current as the current/voltage data set subjected to normalization; and the starting current estimation unit acquires, when the estimated starting current is to be estimated, the present charging rate and the present temperature of the storage battery from the charging rate calculation unit and the temperature detection unit, respectively, in accordance with the current/voltage data set subjected to the normalization, and restores the normalization to an original point based on the correction values corresponding to the charging rate and the temperature of the storage battery that have been acquired, to thereby correct the estimated starting current that has been estimated to the estimated starting current corresponding to the temperature and the charging rate of the storage battery that have been acquired.

3. A storage battery state detection apparatus according to claim 1, wherein:

the starting current learning unit approximates each current/voltage correlation characteristic corresponding to the deterioration state of the storage battery, to thereby derive an approximation equation for each deterioration state; and the starting current estimation unit calculates the estimated starting current by substituting the present voltage immediately before the start of the storage battery into the approximation equation corresponding to the deterioration state of the storage battery.

4. A storage battery state detection apparatus according to claim 1, wherein the starting current learning unit updates the current/voltage correlation characteristic based on n+1 current/voltage data sets that have been stored in the storage unit in time series since n times before until the latest current/voltage data set, where n represents an integer of 1 or larger.

5. A storage battery state detection apparatus according to claim 1, wherein the starting current learning unit updates the current/voltage correlation characteristic by weighting the current/voltage data sets stored in the storage unit in time series in accordance with a time difference from the present time.

6. A storage battery state detection method for estimating a starting minimum voltage of a storage battery before a starter is driven and providing the starting minimum voltage to a control device, the starting minimum voltage corresponding to a voltage value at which a battery voltage of the storage battery drops to a lowest level when the starter is driven, the control device being configured to determine, when determination is made as to whether or not to drive the starter in order to start an internal combustion engine, that the starter is to be driven when the starting minimum voltage of the storage battery is equal to or higher than a threshold value that does not influence the start of the internal combustion engine, the storage battery state detection method comprising:

an internal resistance calculation step of calculating an internal resistance of the storage battery to be used as an index of a deterioration state of the storage battery based on the battery voltage of the storage battery and a discharge current of the storage battery that are acquired while the starter is being driven;

a storage step of storing a current/voltage data set in a storage unit as a current/voltage correlation characteristic for each deterioration state of the storage battery classified in accordance with a magnitude of the internal resistance calculated in the internal resistance calculation step, the current/voltage data set being formed of:

a voltage immediately before the start corresponding to the battery voltage of the storage battery exhibited immediately before the starter is driven; and a measured starting current obtained by subtracting a current immediately before the start, which corresponds to the discharge current of the storage battery acquired immediately before the starter is driven, from a peak current corresponding to a maximum discharge current of the storage battery acquired while the starter is being driven;

a starting current learning step of acquiring the current/voltage data set formed of the voltage immediately before the start and the measured starting current as a measurement result each time the starter is actually driven, and updating the current/voltage correlation characteristic stored in the storage step in the storage unit so as to correspond to the deterioration state classified in accordance with the magnitude of the internal resistance calculated in the internal resistance calculation step;

a starting current estimation step of extracting, when determination is made as to whether or not to drive the starter before driving the starter, the current/voltage correlation characteristic corresponding to the deterioration state of the storage battery, which is identified by the magnitude of the internal resistance calculated in the internal resistance calculation step at a previous time at which the starter is driven, from among the current/voltage correlation characteristics stored in the storage step in the storage unit, and estimating an estimated starting current corresponding to the present voltage immediately before the start of the storage battery, which has been acquired, by using the extracted current/voltage correlation characteristic; and a minimum voltage calculation step of calculating, when determination is made as to whether or not to drive the starter, the starting minimum voltage in accordance with the following expression:

(starting minimum voltage)=(voltage immediately before start)−((internal resistance)×(estimated starting current))

based on the estimated starting current that has been estimated in the starting current estimation step, the present voltage immediately before the start of the storage battery that has been acquired, and the internal resistance of the storage battery calculated in the internal resistance calculation step at the previous time at which the starter is driven.

* * * * *